United States Patent
Okada et al.

(10) Patent No.: US 10,256,599 B2
(45) Date of Patent: Apr. 9, 2019

(54) LASER LIGHT-SOURCE APPARATUS AND LASER PULSE LIGHT GENERATING METHOD

(71) Applicant: SPECTRONIX CORPORATION, Suita-shi, Osaka (JP)

(72) Inventors: Joji Okada, Suita (JP); Yosuke Orii, Suita (JP); Shinichi Murayama, Suita (JP); Daisuke Okuyama, Suita (JP)

(73) Assignee: SPECTRONIX CORPORATION, Osaka (JP)

( * ) Notice: Subject to any disclaimer, the term of this patent is extended or adjusted under 35 U.S.C. 154(b) by 0 days.

(21) Appl. No.: 15/549,360

(22) PCT Filed: Mar. 30, 2016

(86) PCT No.: PCT/JP2016/060369
§ 371 (c)(1),
(2) Date: Nov. 16, 2017

(87) PCT Pub. No.: WO2016/125917
PCT Pub. Date: Aug. 11, 2016

(65) Prior Publication Data
US 2018/0278010 A1    Sep. 27, 2018

(30) Foreign Application Priority Data
Feb. 6, 2015    (JP) ................. 2015-022467

(51) Int. Cl.
*H01S 3/23*    (2006.01)
*G02F 1/11*    (2006.01)
(Continued)

(52) U.S. Cl.
CPC .............. *H01S 3/2316* (2013.01); *G02F 1/11* (2013.01); *G02F 1/3501* (2013.01);
(Continued)

(58) Field of Classification Search
CPC .... H01S 3/2316; H01S 3/0085; H01S 3/0092; G02F 1/3501; G02F 2001/3507
See application file for complete search history.

(56) References Cited

U.S. PATENT DOCUMENTS 8,248,687 B2 *    8/2012    Nishimura ................ G02F 1/39
359/328
9,680,285 B2 *    6/2017    Okada ................. H01S 3/06758
(Continued)

FOREIGN PATENT DOCUMENTS

JP    2010-171131 A    8/2010
JP    2011-192831 A    9/2011
(Continued)

OTHER PUBLICATIONS

Yosuke Orii et al., "High-enery 266-nm picosecond pulse generation from a narrow spectral bandwidth gain-switched LD MOPA," Tech. Digest of CLEO 2013, JTh2A.64 (2013).*
(Continued)

Primary Examiner — Daniel Petkovsek
(74) Attorney, Agent, or Firm — Oliff PLC

(57) ABSTRACT

A laser light-source apparatus includes: a fiber amplifier and a solid-state amplifier to amplify pulse light output from a seed light source serving as a first light source; a nonlinear optical element to perform wavelength conversion on the pulse light output from the solid-state amplifier; an optical switching element to permit or stop propagation of the pulse light from the fiber amplifier to the solid-state amplifier; a second light source disposed on an upstream side of the solid-state amplifier and is configured to output laser light able to be combined with the pulse light output from the seed light source; and a control unit to control the optical switching element in such a manner that the propagation of light is stopped and to perform control in such a manner that the
(Continued)

second light source oscillates, at least in an output period of the pulse light from the seed light source.

16 Claims, 6 Drawing Sheets

(51) Int. Cl.

| | |
|---|---|
| *G02F 1/37* | (2006.01) |
| *H01S 3/067* | (2006.01) |
| *H01S 3/10* | (2006.01) |
| *H01S 5/022* | (2006.01) |
| *H01S 5/06* | (2006.01) |
| *G02F 1/35* | (2006.01) |
| *G02F 1/355* | (2006.01) |
| *H01S 3/00* | (2006.01) |
| *H01S 3/094* | (2006.01) |
| *H01S 3/0941* | (2006.01) |
| *H01S 3/106* | (2006.01) |
| *H01S 3/107* | (2006.01) |
| *H01S 3/16* | (2006.01) |

(52) U.S. Cl.
CPC .............. *G02F 1/3551* (2013.01); *G02F 1/37* (2013.01); *H01S 3/0085* (2013.01); *H01S 3/0092* (2013.01); *H01S 3/067* (2013.01); *H01S 3/06758* (2013.01); *H01S 3/0941* (2013.01); *H01S 3/094003* (2013.01); *H01S 3/094076* (2013.01); *H01S 3/10* (2013.01); *H01S 3/10007* (2013.01); *H01S 3/1068* (2013.01); *H01S 3/23* (2013.01); *H01S 5/022* (2013.01); *H01S 5/06* (2013.01); *G02F 2001/3507* (2013.01); *H01S 3/107* (2013.01); *H01S 3/1611* (2013.01); *H01S 3/1643* (2013.01); *H01S 3/1673* (2013.01); *H01S 2301/02* (2013.01)

(56) References Cited

U.S. PATENT DOCUMENTS

| | | | |
|---|---|---|---|
| 9,859,675 B2* | 1/2018 | Okada | ................ H01S 3/06758 |
| 2013/0044768 A1 | 2/2013 | Ter-Mikirtychev | |
| 2018/0129114 A1* | 5/2018 | Okada | ...................... G02F 1/37 |

FOREIGN PATENT DOCUMENTS

| | | |
|---|---|---|
| JP | 2013-065804 A | 4/2013 |
| WO | 01/28050 A1 | 4/2001 |
| WO | 2008/014331 A2 | 1/2008 |
| WO | 2015/122374 A2 | 8/2015 |

OTHER PUBLICATIONS

Jun. 28, 2016 International Search Report issued in International Patent Application No. PCT/JP2016/060369.
Aug. 8, 2017 International Preliminary Report on Patentability issued in International Patent Application No. PCT/JP2016/060369.
Nov. 6, 2018 Office Action issued in Japanese Patent Application No. 2015-022467.

* cited by examiner

LASER LIGHT-SOURCE APPARATUS AND LASER PULSE LIGHT GENERATING METHOD

This application is based on an application No. 2015-022467 filed in Japan, the contents of which are hereby incorporated by reference.

FIELD OF THE INVENTION

The present invention relates to laser light-source apparatus and a laser pulse light generating method, used for various types of laser processing.

DESCRIPTION OF THE RELATED ART

In recent years, laser light is used for various types of processing. Laser light with a wavelength approximately in a range from 532 nm to 1064 nm has a high energy intensity, and are suitably used for various types of processing such as cutting or welding of metal, glass, and the like. Laser light with a wavelength in a deep ultraviolet region, which is approximately from 200 nm to 350 nm, is used for processing electronic materials and composite materials.

Laser light-source apparatus that outputs laser light with a wavelength shorter than those in a near-infrared region includes: a seed light source that outputs laser light having a wavelength in the near-infrared region; an optical amplifier that amplifies the laser light output from the seed light source; and a nonlinear optical element that converts the wavelength of the laser light, amplified by the optical amplifier, into a target wavelength.

Various optical amplifiers and the like are used for various seed light sources selected to achieve a pulse width of several nanoseconds or shorter, preferably several hundreds of picoseconds or shorter and a pulse rate of several hundreds of megahertz or lower, so that a laser pulse light with large peak power is obtained.

Some conventional configurations use a mode-locked laser with a pulse rate of several tens of megahertz as such a seed light source, and pulse light of several kilohertz is obtained by dividing the frequency of the pulse light output from the seed light source.

Unfortunately, the mode-locked laser involves an oscillating frequency that is fluctuated by environmental factors such as temperature and vibration and thus is difficult to appropriately control. Thus, the frequency division needs to be synchronized with the oscillating frequency of the laser pulse light detected by using a light-receiving element and the like. Thus, a complex circuit configuration is required. Furthermore, long term stable driving is difficult to achieve because the mode-locked laser includes a saturable absorber, which is apt to degrade.

Use of a semiconductor laser that emits pulse light with a controllable oscillating frequency for the seed light source might seem like a solution. Unfortunately, the semiconductor laser is only capable of emitting near-infrared pulse light with extremely small pulse energy of several picojoules to several hundreds of picojoules. Thus, to eventually obtain the pulse light with the pulse energy of several tens of microjoules to several tens of millijoules, much stronger amplification is required than in the case where the conventional seed light source is used.

Suitable examples of the optical amplifier achieving such strong amplification include: a fiber amplifier such as an erbium-doped fiber amplifier and an ytterbium-doped fiber amplifier; and a solid state amplifier such as Nd:YAG obtained by adding neodymium to yttrium aluminum garnet and Nd:YVO4 obtained by adding neodymium to yttrium vanadate.

Patent document and Patent document 2 each disclose an optical amplifier as a combination of the fiber amplifier and the solid state amplifier described above. As described in Patent document 1 and Patent document 2, the fiber amplifier and the solid state amplifier both require an excitation light source for amplifying light with the same wavelength as laser light amplified by a pumping effect a laser active region. Generally, a semiconductor laser is used for such an excitation light source.

PRIOR ART DOCUMENTS

Patent Documents

[Patent document 1] Japanese Unexamined Patent Application Publication No. 2011-192831
[Patent document 2] WO2008/014331

SUMMARY OF INVENTION

Problems to be Solved by the Invention

There might be cases where the output of the pulse light should be temporarily stopped during a processing work performed by using the pulse light output from the laser light-source apparatus. In such a case, stopping of the oscillation of the seed light source or the stopping of the propagation of the pulse light to the light amplifier leads to an excessive population inversion state because the laser active region of each optical amplifier continues to be excited by an excitation laser light source, provided in the optical amplifier. As a result, the next time the seed light source is oscillated or the propagation of the pulse light to the light amplifier is permitted, pulse light (hereinafter, also referred to as "giant pulse") with peak power extremely larger than that in a normal state is output to damage the solid state amplifier, the nonlinear optical, or the like.

When the output of the pulse light is resumed, after being temporally stopped while driving the excitation light source, excessive energy is accumulated in a solid state laser medium of the solid state amplifier in the output stopped state. Thus, the solid state laser medium emits an excessive amount of heat causing a temperature rise to degrade beam propagation characteristics due to thermal lens effect in the solid state laser medium. Thus, the quality of a subject of the processing using the laser pulse light might be adversely affected.

Thus, when the output of the pulse light is temporarily stopped, the power of light from the excitation laser beam source of the solid-state amplifier may be reduced, so that the adjustment for preventing the excessive amount of energy from accumulating in the solid-state laser medium can be achieved.

However, the variable adjustment of the power of the excitation light, which can regulate the temperature rise of the solid-state laser medium, involves fluctuation of power of the excitation light leading to the thermal lens effect resulting in displacement of the beam center of the pulse light when the output of the pulse light is resumed. More specifically, the optical axis of the excitation light incident on the solid-state laser medium is difficult to accurately adjust, and thus is likely to be negatively affected by thermal lens effect due to the fluctuation of the temperature distribution state of the solid-state laser medium attributable to the fluctuation of the power of the excitation light.

In view of the problems described above, an object of the present invention is to provide a laser light-source apparatus and a laser pulse light generating method in which when an output of pulse light from the apparatus is temporarily stopped, a solid state amplifier, a nonlinear optical element, and the like can be prevented from being damaged, so that degradation of the beam propagation characteristics immediately after the output is resumed can be prevented, without stopping or adjusting an excitation light source.

Means for Solving the Problems

A first characteristic configuration of a laser light-source apparatus according to the present invention, for achieving the object described above, is that, as set forth in claim 1: a laser light-source apparatus includes: a first light source configured to output pulse light based on gain switching; a fiber amplifier configured to amplify the pulse light output from the first light source; a solid state amplifier configured to amplify the pulse light output from the fiber amplifier; a nonlinear optical element configured to perform wavelength conversion on the pulse light output from the solid state amplifier and output the resultant pulse light; a second light source that is provided on an upstream side of the solid state amplifier and is configured to output laser light that is able to be combined with the pulse light output from the first light source (the seed light source); a control unit configured to achieve, in an output permitted state in which the nonlinear optical element outputs the pulse light, an output stopped state in which the nonlinear optical element stops outputting the pulse light by stopping propagation of the pulse light from the first light source to the solid state amplifier, with power of excitation light to the solid state amplifier maintained, and to perform control in such a manner that the second light source oscillates in the output stopped state.

When the control unit stops the propagation of the pulse light output from the first light source, serving as the seed light source, to the solid state amplifier, the output stopped state is achieved in which the output of the pulse light from the nonlinear optical element stops. Here, even when the power of the excitation light for the solid state amplifier is maintained, the energy in the active region of the solid state amplifier in the excited state is discharged with the laser light output from the second light source propagating to the solid state amplifier along the optical axis of the pulse light from the seed light source. Thus, temperature rise due to the solid state amplifier emitting excessive heat can be prevented.

As a result, when the pulse light from the first light source propagates to the solid state amplifier after transition from the output stopped state occurs, degradation of the beam propagation characteristics due to thermal lens effect occurring in the solid state amplifier and fluctuation of an output level due to temperature change do not occur. Thus, the nonlinear optical element stably outputs the pulse light, whereby a processing on a processing target can be stably resumed with no negative impact on the quality of the processing target.

A second characteristic configuration of the laser light-source apparatus according to the present invention is that, as set forth in claim 2: an optical switching element that is disposed between the fiber amplifier and the solid state amplifier, and is configured to permit or stop propagation of light from the fiber amplifier to the solid state amplifier may be further provided, and the control unit may be configured to achieve the output stopped state in which the nonlinear optical element stops outputting the pulse light by controlling the optical switching element in such a manner that the propagation of light is stopped at least in an output period of pulse light from the first light source, and to perform control in such a manner that the second light source oscillates in the output stopped state.

With the control unit controlling the optical switching element in the output period of the pulse light from the first light source, no pulse light propagates from the fiber amplifier to the solid state amplifier, whereby the output stopped state in which the output of the pulse light from the nonlinear optical element stops can be achieved without stopping output of the pulse light from the first light source.

A third characteristic configuration of the laser light-source apparatus according to the present invention is that, as set forth in claim 3: the control unit may be configured to control the optical switching element in such a manner that the propagation of the light is permitted in a period other than the output period of the pulse light from the first light source in the output stopped state, and to perform control in such a manner that the second light source oscillates at least in the period other than the output period of the pulse light from the first light source outputs in the output stopped state, in addition to the second characteristic configuration described above.

It has been widely known that when the pulse light output from the first light source is amplified by the fiber amplifier, the spectrum is widened over the bandwidth of this signal light due to chirping effect, self-phase modulation or Raman scattering in the optical fiber, or the like, and amplified spontaneous emission noise (hereinafter, referred to as ASE noise) is also produced, and thus the SN ratio of the pulse light degrades. With the control unit controlling the optical switching element in such a manner that the propagation of light is permitted in the period other than the output period of the pulse light from the first light source, the laser light output from the second light source and the ASE noise propagate to the solid state amplifier. Thus, the energy in the active region of the solid state amplifier in the excited state due to the excitation light source is discharged.

A fourth characteristic configuration of the laser light-source apparatus according to the present invention is that, as set forth in claim 4: the control unit may be configured to achieve the output permitted state in which the output of the pulse light from the nonlinear optical element is permitted by controlling the optical switching element in such a manner that the propagation of light is permitted in the output period of the pulse light from the first light source and is stopped in the period other than the output period of the pulse light from the first light source, and to perform control in such a manner that the second light source stops oscillating in the output permitted state, in addition to the second or the third characteristic configuration.

When the frequency of the pulse light is in the order of megahertz or higher, the ASE noise is so small that would not be much of a problem. The adverse effect of the ASE noise is large when the oscillating frequency of the pulse light is in a range lower than one megahertz. Specifically, a part of the energy of the excitation light, input for the amplification of the solid state amplifier on the downstream stage, is wastefully used for amplifying such a noise component. Thus, not only the amplification gain is low due to a low energy use efficiency for amplifying the pulse light, but also the energy consumed for amplifying the noise component leads to excessively emitted heat. As a result, a larger component cost and the like are required for cooling the solid state amplifier and the like.

In the output permitted state in which the output of the pulse light from the nonlinear optical element is permitted, the control unit performs control in such a manner that the second light source stops oscillating, and controls the optical switching element in such a manner that the output of the pulse light from the first light source is stopped in the period other than the output period of the pulse light from the first light source. Thus, the propagation of the ASE noise and the continuous light to the solid state amplifier is prevented. Thus, the energy in the active region of the solid state amplifier can be prevented from being wastefully consumed.

Then, when the control unit controls the optical switching element in such a manner that the output permitted state is achieved in such a manner that the propagation of the pulse light, from the fiber amplifier to the solid state amplifier, is permitted only in the output period of the pulse light from the first light source, and control is performed in such a manner that the second light source stops oscillating in the output permitted state. Thus, the pulse light is amplified by the solid state amplifier with a high energy efficiency, whereby the pulse light with large peak power is output from the nonlinear optical element. In this manner, the optical switching element functions as a filter that removes the ASE noise in a time domain.

A fifth characteristic configuration of the laser light-source apparatus according to the present invention is that, as set forth in claim 5: the laser light output from the second light source may be configured to be capable of being combined with the pulse light output from the first light source, on an upstream side of the optical switching element, and the control unit may be configured to perform control in such a manner that the second light source oscillates in the output stopped state in addition to third or the fourth characteristic configuration described above.

When the second light source is disposed on the upstream side of the optical switching element, control may not be performed in such a manner that the second light source oscillates or stops in synchronization with the optical switching element after the transition to the output stopped state. Instead, control may be simply performed in such a manner that the second light source oscillates. This is because the optical switching element prevents the output light from the second light source from propagating in the output period of the pulse light from the first light source, and permits the output light from the second light source to be propagated to the solid state amplifier in the period other than the output period of the pulse light from the first light source.

A sixth characteristic configuration of the laser light-source apparatus according to the present invention is that, as set forth in claim 6: the control unit may be configured to adjust power of the laser light output from the second light source to be input to the solid state amplifier in such a manner that the solid state amplifier outputs light with substantially same average power in the output stopped state and in the output permitted state, in addition to any one of the first to the fifth characteristic configurations described above.

The power of the laser light output from the second light source to be input to the solid state amplifier is adjusted in such a manner that the solid state amplifier outputs light with substantially the same average power in the output stopped state and in the output permitted state. Thus, the power of the excitation light for the solid state amplifier is maintained to be the same between the output permitted state and the output stopped state. This ensures the thermal stability of the solid state amplifier. Thus, the temperature rise due to the solid state amplifier emitting excessive heat after the transition from the output permitted state to the output stopped state can be prevented.

A seventh characteristic configuration of the laser light-source apparatus according to the present invention is that, as set forth in claim 7: power of excitation light from the solid state amplifier and/or a pulse rate of the pulse light may be adjusted in such a manner that the nonlinear optical element outputs wavelength converted light with predetermined power only in the output permitted state, in addition to any one of the first to the sixth characteristic configurations described above.

With the power of excitation light from the solid state amplifier and/or the pulse rate of the pulse light adjusted, wavelength converted light with which the processing target can be processed is output only in the output permitted state. In the output stopped state, even when the wavelength converted light is output from the nonlinear optical element, troubles such as unwanted processing on the processing target can be prevented.

An eighth characteristic configuration of the laser light-source apparatus according to the present invention is that, as set forth in claim 8: an optical switching element that is disposed between the solid state amplifier and the nonlinear optical element, and is configured to permit or stop propagation of light from the solid state amplifier to the nonlinear optical element may be further provided, and the control unit may be configured to control the optical switching element in such a manner that the propagation of light from the solid state amplifier to the nonlinear optical element is stopped in the output stopped state, in addition to any one of the first to the sixth characteristic configurations described above.

With the optical switching element stopping the propagation of light from the solid state amplifier to the nonlinear optical element in the output stopped state, the wavelength converted light with which the processing target can be processed is output only in the output permitted state. Thus, troubles such as unwanted processing on the processing target can be prevented in the output stopped state.

A ninth characteristic configuration of the laser light-source apparatus according to the present invention is that, as set forth in claim 9: the second light source may have an oscillation wavelength set to be within an amplification band of the solid state amplifier in which the pulse light output from the first light source is able to be amplified, in addition to any one of the first to the eighth characteristic configurations described above.

With the second light source set to have the oscillation wavelength within the amplification band of the solid state amplifier, the excitation energy accumulated in the solid state amplifier after the transition to the output stopped state is consumed for amplifying the laser light output from the second light source. The laser light output from the second light source with inherently low power would not be output as the wavelength converted light with large peak power from the nonlinear optical element even when the light is amplified by the solid state amplifier.

A tenth characteristic configuration of the laser light-source apparatus according to the present invention is that, as set forth in claim 10: the second light source may have an oscillation wavelength in an amplification band, in an amplification band of the solid state amplifier, different from an amplification band in which the pulse light output from the first light source is able to be amplified, in addition to any one of the first to the eighth characteristic configurations described above.

The solid state amplifier may have a plurality of amplification bands, and the oscillation wavelength of the second light source may be set to be within one of the amplification bands other than that with which the pulse light output from the first light source can be amplified. In such a configuration, the excitation energy accumulated in the solid state amplifier after the transition to the output stopped state can be consumed for amplifying the laser light output from the second light source. The laser light output from the second light source inherently has a wavelength outside that band in which the wavelength conversion by the nonlinear optical element can be achieved. Thus, even when the laser is amplified by the solid state amplifier and then input to the nonlinear optical element, the wavelength converted light will not be output.

An eleventh, characteristic configuration of the laser light-source apparatus according to the present invention is that, as set forth in claim 11: the optical switching element may include a dynamic optical element including an acousto-optic element or an electro-optic element.

As the optical switching element, an acousto-optic element that turns ON or OFF the primary diffracted light in accordance with the turning ON or OFF of an ultrasound transducer, or an electro-optic element that turns ON and OFF light with an electric field in accordance with intensity modulation through EO modulation is preferably used as the dynamic optical element.

A twelfth characteristic configuration of the laser light-source apparatus according to the present invention is that, as set forth in claim 12: the seed light source may include a DFB laser, and the control unit may be configured to drive the DFB laser with a frequency of several megahertz or lower and a pulse width of several hundreds of nanoseconds or shorter.

When the DFB laser employing the gain switching is used as the seed light source, single longitudinal mode pulse light having a higher intensity than in a normal state can be obtained. With the gain switching, pulse light with a monochromatic wave or a desired frequency that is several megahertz or lower and having a desired pulse width that is several hundreds of nanoseconds or shorter can be easily generated. By using the optical switching element described above for the pulse light, pulse light with a higher average output and a desired wavelength can be efficiently obtained in a stable state.

A first characteristic configuration of a laser pulse light generating method according to the present invention is, as set forth in claim 13: a laser pulse light generating method in which pulse light output from a first light source based on gain switching is sequentially amplified by a fiber amplifier and a solid state amplifier, subjected to wavelength conversion by a nonlinear optical element, and then is output, includes stopping propagation of the pulse light from the first light source to the solid state amplifier with power of excitation light to the solid state amplifier maintained, and performing control in such a manner that a second light that is provided on an upstream side of the solid state amplifier and is configured to output laser light that is able to be combined with the pulse light output from the first light source oscillates, when the output of the pulse light from the nonlinear optical element is stopped.

A second characteristic configuration of the laser pulse light generating method according to the present invention is that, as set forth in claim 14: the laser pulse light generating method may further include: controlling optical switching element that is disposed between the fiber amplifier and the solid state amplifier in such a manner that the propagation of light is stopped in an output period of the pulse light from the first light source and is permitted in a period other than the output period of the pulse light from the first light source; and performing control in such a manner that the second light that is provided on the upstream side of the solid state amplifier and is configured to output the laser light that is able to be combined with the pulse light output from the first light source oscillates at least in the period other than the output period of the pulse light from the first light source, in addition to the first characteristic configuration described above.

A third characteristic configuration of the laser pulse light generating method according to the present invention is that, as set forth in claim 15: the laser pulse light generating method may further include: controlling the optical switching element in such a manner that the propagation of light is permitted in the output period of the pulse light from the first light source and stopped in the period other than the output period of the pulse light from the first light source; and performing control in such a manner that the second light source stops oscillating, when the output of the pulse light from the nonlinear optical element is permitted, in addition to the second characteristic configuration described above.

Effects of Invention

As described above, the present invention can provide a laser light-source apparatus and a laser pulse light generating method in which when an output of pulse light from the apparatus is temporarily stopped, a damage of a solid state amplifier, a nonlinear optical element, and the like can be prevented and thus degradation of beam propagation characteristics immediately after the output is resumed can be prevented, without stopping or adjusting an excitation light source.

DESCRIPTION OF THE PREFERRED EMBODIMENTS

Embodiments of a laser light-source apparatus and a laser pulse light generating method according to the present invention are described below.

Figure 1:
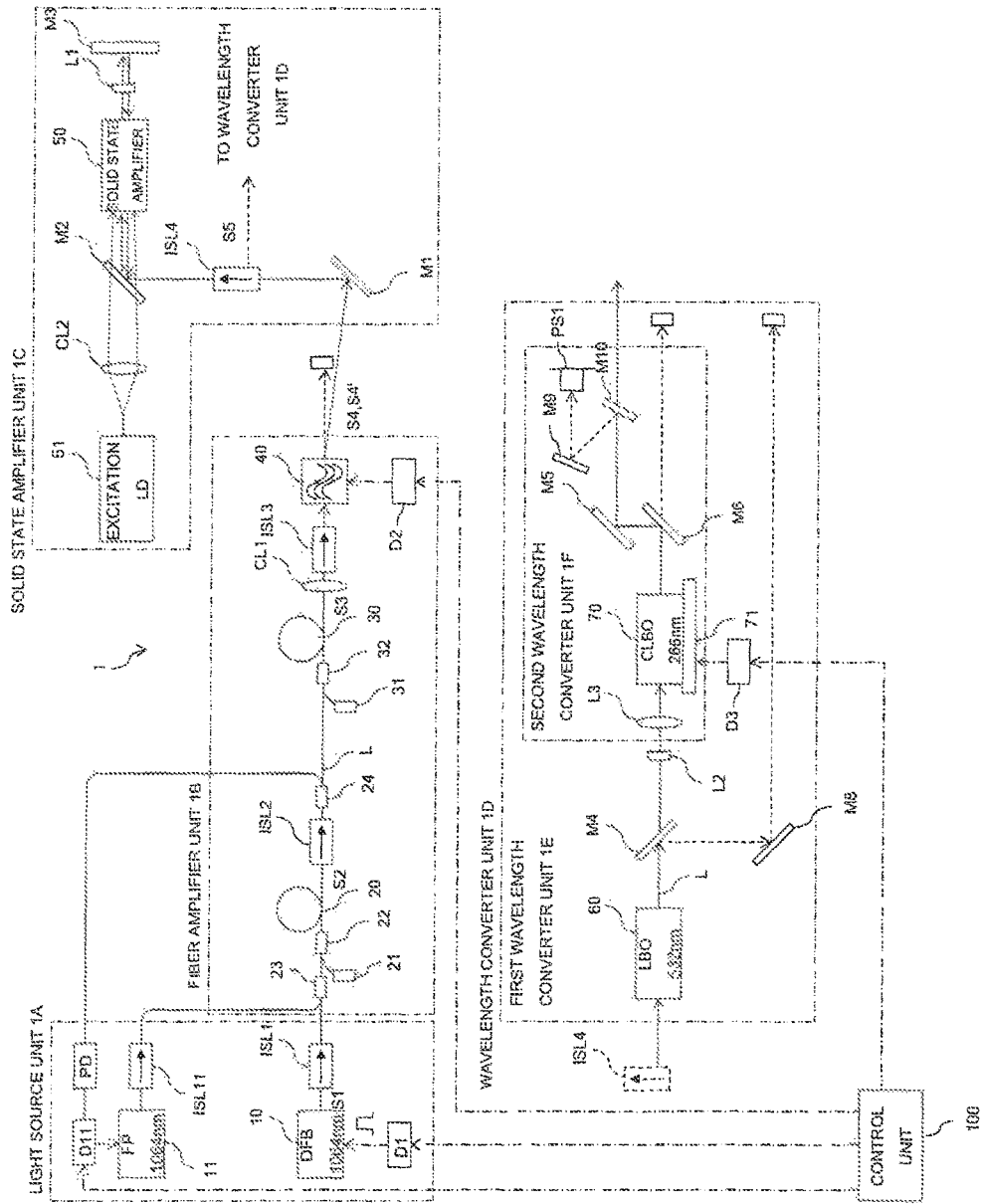
FIG. 1 is a block diagram illustrating a configuration of a laser light-source apparatus according to the present invention.

FIG. 1 illustrates an example of a configuration of a laser light-source apparatus 1 according to the present invention. The laser light-source apparatus 1 includes a light source unit 1A, a fiber amplifier unit 1B, a solid state amplifier unit 1C, and a wavelength conversion unit 1D that are arranged along an optical axis L, and further includes a control unit 100 that controls the light source unit 1A and the like.

The light source unit 1A includes: a seed light source 10 serving as a first light source according to the present invention; a driver D1 for the seed light source; an optical isolator ISL1 for the seed light source; a laser light source 11 serving as a second light source according to the present invention; a driver D11 for the laser light source; an optical isolator ISL11 for the laser light source; and a photodiode PD for monitoring the power of output light from the laser light source 11.

The fiber amplifier unit 1B includes: fiber amplifiers 20 and 30, in two stages, respectively including excitation light sources 21 and 31, each including a laser diode, and multiplexers 22 and 32; optical isolators ISL2 and ISL3; an optical switching element 40; and the like.

The fiber amplifier 20 on an upstream stage has an input side provided with a multiplexer 23 and an output side provided with a demultiplexer 24. The multiplexer 23 can combine laser light output from the laser light source 11 with pulsed laser light output from the seed light source 10. The demultiplexer 24 guides output light from the fiber amplifier 20 to the photodiode PD.

The solid state amplifier unit 1C includes a solid state amplifier 50, an excitation light source 51, reflection mirrors M1, M2, and M3, a lens L1, a collimator CL2, and the like. The wavelength conversion unit 1D includes a first wavelength conversion unit 1E and a second wavelength conversion unit 1F that are respectively provided with nonlinear optical elements 60 and 70.

Laser pulse light (hereinafter, also simply referred to as "pulse light") with a wavelength of 1064 nm, output from the seed light source 10, is amplified by the fiber amplifiers 20 and 30 in the two stages, and then is further amplified to a desired level by the solid state amplifier 50 in a single stage. The pulse light amplified by the solid state amplifier 50 is subjected to wavelength conversion by the nonlinear optical element 60 to have a wavelength of 532 nm, further subjected to wavelength conversion by the nonlinear optical element 70 to have a wavelength of 266 nm, and then is output.

The number of fiber amplifiers and solid state amplifiers are not particularly limited, and may be set as appropriate to achieve a desired amplification gain for the pulse light. For example, three fiber amplifiers may be cascaded, and two solid state amplifiers may be cascaded in the subsequent stage.

A distributed feedback laser diode (hereinafter, referred to as a "DFB laser") that outputs a single longitudinal mode laser light is used for the seed light source 10. The DFB laser outputs pulse light with a monochromatic wave or a desired frequency that is several megahertz or lower and having a desired pulse width that is several nanoseconds or shorter, and is preferably several hundreds of picoseconds or shorter, in response to a control signal output from the control unit 100 employing gain switching.

A general-purpose semiconductor laser using a Fabry-Perot oscillator that can output continuous light or pulse light is used as the laser light source 11.

The pulse light, having the pulse energy of several to several hundreds of picojoules, output from the seed light source 10, is amplified by the fiber amplifiers 20 and 30 and the solid state amplifier 50 to have the final pulse energy of several tens of microjoules to several tens of millijoules. Then, the resultant pulse light is input to the two-stage nonlinear optical elements 60 and 70 to be subjected to the wavelength conversion. As a result, deep ultraviolet light with a wavelength of 266 nm is obtained.

The pulse light output from the seed light source 10 is amplified in the fiber amplifier 20 on the upstream stage, through the optical isolator ISL1. A rare-earth-doped optical fiber, such as an ytterbium (Yb)-doped fiber amplifier excited by the excitation light source 21 with a predetermined wavelength (for example 975 nm) is used for the fiber amplifiers 20 and 30. The population inversion of such a fiber amplifier 20 lasts for milliseconds, and thus energy excited by the excitation light source 21 is efficiently transferred to the pulse light having a frequency of 1 kilohertz or higher.

The pulse light that has been amplified by the fiber amplifier 20 on the upstream stage by about 30 decibels is input to the fiber amplifier 30 on the downstream stage through the optical isolator ISL2 to be amplified by about 25 decibels. The pulse light that has been amplified in the fiber amplifier 30 on the downstream stage is subjected to beam shaping by a collimator CL1, and then is guided to the solid state amplifier 50, after passing through the optical isolators ISL3 and ISL4, to be amplified by about 25 decibels.

An Acousto-Optic Modulator (AOM) that includes an acousto-optic element and functions as the optical switching element 40 and a pair of reflection mirrors M1 and M2 are disposed between the collimator CL1 and the solid state amplifier 50. An optical isolator ISL4 that guides the pulse light amplified by the solid state amplifier 50 to the nonlinear optical element 60 is disposed between the reflection mirrors M1 and M2.

The optical isolators ISL1 to ISL4 described above are each a polarization-dependent optical isolator that blocks return light by rotating the plane of polarization to be in a reverse direction for a direction opposite to the forward direction, through the magneto-optical effect. Thus, the optical isolators ISL1 to ISL4 are disposed, for example, to prevent the optical elements disposed on the upstream side along the optical axis from breaking due to heat of the return light with a high intensity.

A solid state laser medium such as a Nd:YVO4 crystal or a Nd:YAG crystal is preferably used for the solid state amplifier 50. The solid state laser medium is excited by excitation light output from the excitation light source 51, including a laser diode that emits light having a wavelength of 808 nm or 888 nm, and then is subjected to beam shaping by the collimator CL2.

The pulse light that has passed through the optical switching element 40 enters the solid state amplifier 50 via the reflection mirrors M1 and M2 to be amplified, and then is reflected by the reflection mirror M3 to reenter the solid state amplifier 50 to be amplified again. Thus, the pulse light is amplified while passing through the solid state amplifier 50 in opposite directions. The lens L1 is for beam shaping.

The pulse light amplified by the solid state amplifier 50 is reflected by the reflection mirror M2 and the optical isolator ISL4. Thus, the pulse light enters the nonlinear optical elements 60 and 70 of the wavelength conversion unit 1D to have the wavelength converted into a desired wavelength, and then is output.

The first wavelength conversion unit 1E includes a LBO crystal ($LiB_3O_5$) serving as the nonlinear optical element 60, and the second wavelength conversion unit 1F includes a CLBO crystal ($CsLiB_6O_{10}$) serving as the nonlinear optical element 70. The pulse light, with a wavelength of 1064 nm, output from the seed light source 10, is subjected to wavelength conversion in the nonlinear optical element 60 to have a wavelength of 532 nm, and then is subjected to wavelength conversion in the nonlinear optical element 70 to have a wavelength of 266 nm.

Reflection mirrors M4 and M8 function as filters for separating the pulse light having a wavelength of 1064 nm output from the nonlinear optical element 60. CA reflection mirror M6 functions as a filter for separating the pulse light having a wavelength of 532 nm output from the nonlinear optical element 70. Each pulse light thus separated is attenuated by an optical damper.

The second wavelength conversion unit 1F is provided with a stage 71 serving as a scanning mechanism that causes the CLBO crystal ($CsLiB_6O_{10}$) to move in a plane orthogonal to the optical axis, so that the position on the CLBO crystal ($CsLiB_6O_{10}$) irradiated with the pulse light is shifted at a predetermined timing. This is because when the same position on the CLBO crystal ($CsLiB_6O_{10}$) is irradiated with the ultraviolet ray for a long period of time, the CLBO crystal ($CsLiB_6O_{10}$) is optically damaged to have the intensity distribution and the wavelength conversion output performance degraded.

The control unit 100 includes a circuit block including a Field Programmable Gate Array (FPGA), a peripheral circuit, and the like. A plurality of logical elements are driven based on a program stored in a memory in the FPGA in advance, so that, for example, the blocks of the laser light-source apparatus 1 are sequentially controlled. The control unit 100 may employ a configuration including a microcomputer, a memory, and a peripheral circuit such as an IO or a configuration including a programmable logic controller (PLC), instead of the configuration including the FPGA.

Specifically, the control unit 100 transmits a trigger signal, having a predetermined pulse width, to the driver D1 of the DFB laser serving as the seed light source 10 so that the seed light source 10 emits light based on gain switching. When a pulse current, corresponding to the trigger signal, is applied to the DFB laser from the driving circuit, relaxation oscillation occurs. Here, a laser pulse light is output that includes only a first wave corresponding to e highest emission intensity immediately after the start of the light emission by the relaxation oscillation and includes no sub-pulses as a second wave and after. The gain switching is a method of thus generating pulse light with a short pulse width and large peak power through the relaxation oscillation.

The control unit 100 outputs a gate signal to an RF driver D2 that drives the AOM serving as the optical switching element 40. A transducer (piezoelectric conversion element) that has received a high frequency signal from the RF driver D2 generates a diffraction grating in the crystal of the acousto-optic element, so that diffracted light of the pulse light that has entered the acousto-optic element is made incident on the reflection mirror M1. When the RF driver D2 is stopped, the pulse light passes through the acousto-optic element without being diffracted, and thus is not made incident on the reflection mirror M1. The light that has passed through the acousto-optic element while the RF driver D2 is stopped is attenuated by the optical damper.

When the optical switching element 40 is turned ON by the gate signal, the light diffracted by the acousto-optic element propagates to the solid state amplifier 50 from the fiber amplifier 30. When the optical switching element 40 is turned OFF by the gate signal, the propagation of the light to the solid state amplifier 50 from the fiber amplifier 30 is stopped.

Figure 2A:
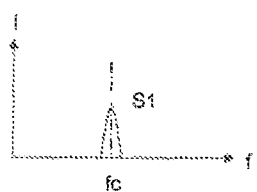
FIG. 2A is a diagram illustrating frequency and time axis characteristics of narrowband pulse light emitted from a first light source.
Figure 2A:
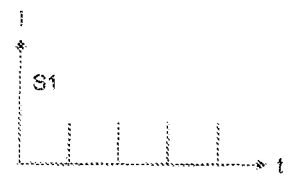
Figure 2B:
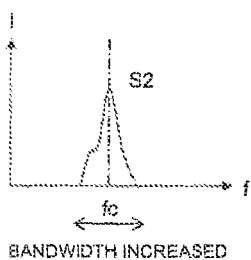
FIG. 2B and FIG. 2C are diagrams illustrating frequency characteristics and throe axis characteristics of pulse light with a bandwidth increased due to self-phase modulation and Raman scattering in a fiber amplifier.
Figure 2B:
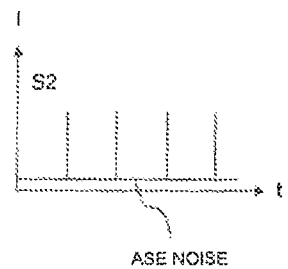
Figure 2C:
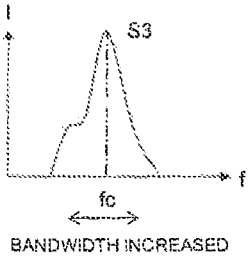
Figure 2C:
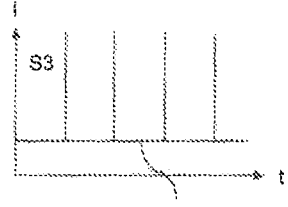

In each of FIG. 2A, FIG. 2B, and FIG. 2C, the frequency characteristics of the pulse light propagating in components of the laser light-source apparatus 1 is illustrated in a left side figure, and the time axis characteristics of the pulse light is illustrated in a right side figure. In the figures, the reference sign Sn (n is an integer) represents an optical signal Sn (n=1, 2, . . . ) from an output node of components of the laser light-source apparatus 1 illustrated in FIG. 1.

Figure 3A:
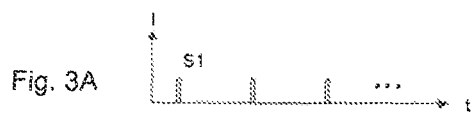
FIG. 3A is a diagram illustrating pulse light periodically emitted from the first light source.
Figure 3B:
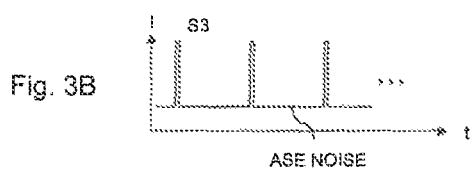
FIG. 3B is a diagram illustrating pulse light in which ASE noise has been superimposed in a downstream stage fiber amplifier.

Laser pulse light having a small bandwidth with the center wavelength of 1064 nm (see FIG. 2A and FIG. 3A) is output from the DFB laser, serving as the seed light source 10, at a predetermined cycle, in response to the trigger signal output from the control unit 100. When the pulse light output from the seed light source 10 is guided by the fiber amplifier 20 and amplified, an unwanted spectrum width increase occurs due to self-phase modulation, Raman scattering, and the like. Furthermore, the ASP noise is produced, and thus the S/N ratio of the optical pulse is degraded (see FIG. 2B). A further increase in the bandwidth and a further increase in the ASE noise level occur (see FIG. 2C and FIG. 3B) when the pulse light is guided to and amplified by the fiber amplifier 30 on the downstream stage.

The pulse light amplified by the fiber amplifiers 20 and 30 needs to be further amplified by the solid state amplifier 50 on the downstream stage to achieve larger peak power, so that the deep ultraviolet pulse light of a predetermined intensity can be obtained. The range of wavelengths achievable by the wavelength conversion by the wavelength conversion unit 1D is limited by the characteristics of the nonlinear optical elements 60 and 70. Thus, the energy used for the amplification does not efficiently contribute to the wavelength conversion. All things considered, the wavelength conversion efficiency is low.

The excitation energy of the solid state amplifier 50 is wastefully consumed for the pulse light with an increased bandwidth and the amplification of the ASE noise. Thus, the energy efficiency is low. When the excitation energy is increased to offset the wastefully consumed amount, a large scale cooling device is required for preventing damages due to emitted heat on the elements. Thus, the cost of the laser light-source apparatus 1 increases. When the frequency of the pulse light is in the order of megahertz or higher, the ASE noise is so small that would not be much of a problem. The adverse effect of the ASE noise is large when the oscillating frequency of the pulse light is in a range lower than one megahertz.

There might be cases where the output of the pulse light with a wavelength in the deep ultraviolet region output from the laser light-source apparatus 1 should be temporarily stopped during laser processing performed by using such pulse light. In such a case, stopping of the oscillation of the seed light source 10 or the stopping of the propagation of the pulse light to the light amplifiers 20, 30, and 50 leads to an excessive population inversion state because each laser active region continues to be excited by excitation laser beam sources, provided in the light amplifiers 20, 30, and 50.

As a result, the next time the seed light source is oscillated or the propagation of the pulse light to the light amplifier 50 is permitted, the giant pulse is output to damage the solid state amplifier 50, the nonlinear optical element on the downstream stage, or the like.

Thus, in the present embodiment, the control unit 100 controls the optical switching element 40 in such a manner that the propagation of light is permitted in an output period of the pulse light from the seed light source 10, and stopped in a period other than the output period of the pulse light from the seed light source 10. Thus, an output permitted state where the output of the pulse light from the nonlinear optical elements 60 and 70 is permitted is achieved.

The control unit 100 controls the optical switching element 40 in such a manner that the propagation of light is stopped in the output period of the pulse light from the seed light source 10 and is permitted in a period other than the output period of the pulse light from the seed light source 10. Thus, an output stopped state is achieved in which the output of the pulse light from the nonlinear optical elements 60 and 70 is stopped.

The concept of the "output stopped state" as used herein includes wavelength converted light being output from the nonlinear optical elements 60 and 70, with power that is not 0 but is low enough to be substantially unusable for processing a processing target object.

When the control unit 100 turns OFF the optical switching element 40 in the period other than the output period of the pulse light from the seed light source 10 in the output permitted state, the ASE noise is prevented from propagating to the solid state amplifier 50 on the downstream stage in this period. As a result, the energy in an active region of the solid state amplifier 50 is prevented from being wastefully consumed (see a section Toff in FIG. 3C).

Figure 3C:
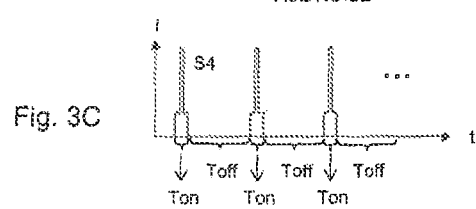
FIG. 3C is a diagram illustrating pulse light passing through an optical switching element in synchronization with an oscillation period of the first light source in a time domain.
Figure 3D:
FIG. 3D is a diagram illustrating ASE noise passing though the optical switching element before and after the oscillation period of the first light source in a time domain.
Figure 3E:
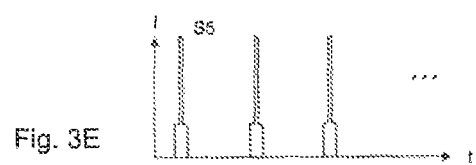
FIG. 3E is a diagram illustrating pulse light amplified by a solid state amplifier after passing through the optical switching element in synchronization with the oscillation period of the first light source in the time domain.

Then, when the optical switching element 40 is turned ON by the control unit 100 in the output period of the pulse light from the seed light source 10, the pulse light propagates from the fiber amplifier 30 to the solid state amplifier 50 (see a section Ton in FIG. 3C). Thus, the pulse light is amplified with a high energy efficiency (see FIG. 3E), whereby the pulse light with large peak power is output from the nonlinear optical element. In this manner, the optical switching element 40 functions as a filter that removes the ASE noise in a time domain.

When the control unit 100 turns OFF the optical switching element 40 in the output period of the pulse light from the seed light source 10, the pulse light is prevented from propagating to the solid state amplifier 50 from the fiber amplifier 30. Thus, the output stopped state in which the output of the pulse light from the nonlinear optical elements 60 and 70 is stopped can be easily achieved without stopping the seed light source 10.

When the optical switching element 40 is turned ON by the control unit 100 in the period other than the output period of the pulse light from the seed light source 10 in the output stopped state, the ASE noise generated in the fiber amplifier 30 on the upstream stage propagates to the solid state amplifier on the downstream stage (see FIG. 3C). Thus, the energy in the active region of the solid state amplifier 50, which has been put into the excited state by the excitation light source 51, is discharged.

As a result, no giant pulse is generated to damage the solid state amplifier 50 and the nonlinear optical elements 60 and 70, even when the control unit 100 turns ON the optical switching element 40 in the output period of the pulse light from the seed light source 10 and the pulse light is output from the wavelength conversion devices 60 and 70, in the output permitted state achieved after the output stopped state.

Figure 4:
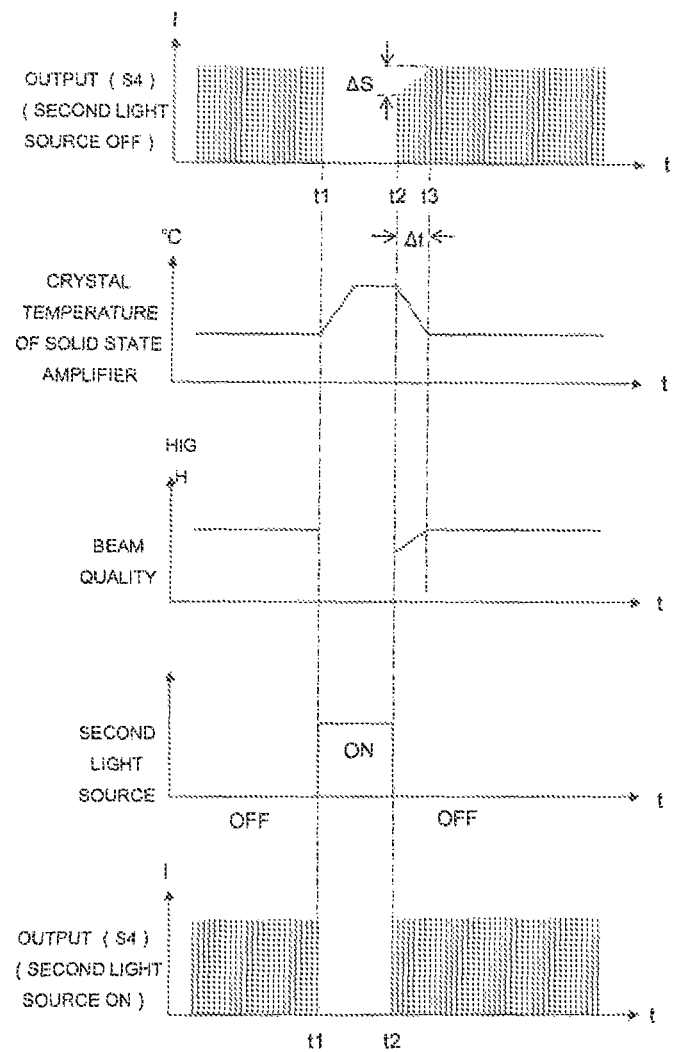
FIG. 4 is a diagram illustrating output fluctuation and stabilization occurring in a transition from an output stop period to an output permitted period.

Still, as illustrated in FIG. 4, the energy accumulated in the active region of the solid state amplifier 50 cannot be sufficiently discharged only with the ASE noise propagated to the solid state amplifier 50 in the output stopped state. Thus, the solid state amplifier 50 emits an excessive amount of heat, resulting in temperature rise. Thus, while the giant pulse can be prevented from occurring at the point where the output permitted state is achieved, beam propagation characteristics might be degraded to have a negative impact on a quality of a processing target using pulsed laser light.

As can be seen in the uppermost section in FIG. 4 (output (S4) (second light source OFF)), power reduction ΔS occurs due to the degradation of the beam propagation characteristics in a time period Δt between a time point t2, at which transition from the output stopped state to the output permitted state is achieved again after the transition from the output permitted state to the output stopped state is achieved at a time point t1, and a time point t3 thereafter.

As illustrated in a second section (crystal temperature of the solid state amplifier) in FIG. 4, the crystal temperature of the solid state amplifier, which has been at a substantially constant level in the output permitted state, gradually rises after the time point t1 due to the energy accumulated by the excitation light during the output stopped state. Then, during the time period Δt between the time point t2 at which the output stopped state is restored and a point at which the crystal temperature at the constant level described above is achieved, the beam quality degrades from the previous quality at the constant level, as illustrated in a third section (beam quality) in FIG. 4. The time period Δt, which is variable depending on the length of the output stopped state, is approximately 0.5 seconds to 60 seconds.

Thus, as illustrated in a fourth section (second light source) in FIG. 4, in the laser light source apparatus 1 according to the present invention, the control unit 100 performs control in such a manner that the laser light source 11 (see FIG. 1), serving as the second light source, disposed on the upstream side of the solid state amplifier 50, oscillates while the apparatus is in the output stopped state between the time point t1 and the time point t2, and stops oscillating while the apparatus is in the output permitted state at and after the time point t2.

Figure 3F:
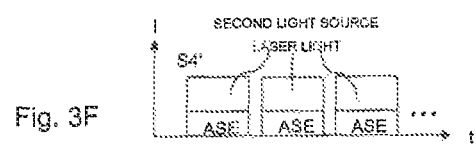
FIG. 3F is a diagram illustrating the ASE noise that passes through the optical switching element before/after the oscillation period of the first light source in the time domain and a laser light output from a second light source.

The laser light, which is continuous light output from the laser light source 11, propagates to the solid state amplifier 50 via the optical switching element 40 in a period different from the output period of the pulse light from the seed light source 10. Thus, the energy in the active region of the solid state amplifier 50 in the excited state achieved by the light source 51 for excitation is discharged (see FIG. 3F).

As a result, as illustrated in the lowermost section (output (S4) (second light source ON)) in FIG. 4, the temperature rise due to excessive heat emitted from the solid state amplifier 50 in response to the excitation energy does not occur. Thus, the nonlinear optical element 70 can output stable pulse light immediately after the output from the wavelength converter unit 1D resumes with the control unit 100 controlling the optical switching element 40 at the time point t2 at the end of the output stopped state so that the pulse light from the seed light source 10 propagates to the solid state amplifier 50. Thus, the processing can be stably resumed so that there is no negative impact on the quality of the processing target, with the degradation of the beam propagation characteristics due to thermal lens effect of the solid state amplifier 50 or the like prevented and fluctuation of an output level due to temperature fluctuation prevented.

More specifically, in a state where the power of excitation light to the solid state amplifier 50 is maintained, the control unit 100 adjusts the power of the laser light output from the laser light source 11 to be input to the solid state amplifier 50, in such a manner that the solid state amplifier 50 outputs light with substantially the same average power in the output stopped state and in the output permitted state.

A general-purpose semiconductor laser using a Fabry-Perot oscillator used for the laser light source 11 is set to have an oscillation wavelength within an amplification band of the solid state amplifier 50 with which the pulse light with the wavelength of 1064 μm output from the seed light source 10 can be amplified.

With the laser light source 11 set to have the oscillation wavelength within the amplification band of the solid state amplifier 50, the excitation energy accumulated in the solid state amplifier 50 after the transition to the output stopped state is consumed for amplifying the laser light output from the laser light source 11. The laser light output from the laser light source 11 is not pulse light with large peak power output from the seed light source 10. Thus, the laser light would not be output as wavelength converted light with enough power to process the processing target from the nonlinear optical elements 60 and 70 even after the amplification by the solid state amplifier 50.

Figure 5A:
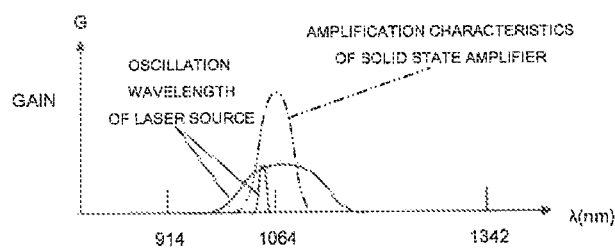
FIG. 5A and FIG. 5B are diagrams illustrating a relationship between an amplification band of the solid-state amplifier and an oscillation wavelength of the second light source.

As illustrated in FIG. 5A, when the laser light source 11 that can oscillate a laser light with a narrow bandwidth shifted on one side of the center of the amplification band of the solid state amplifier 50 is used, amplification does not involve a large gain. Thus, the wavelength converted light with sufficiently large power to process the processing target will not be output from the nonlinear optical elements 60 and 70, even after the amplification by the solid state amplifier 50.

For example, when the seed light source 10 outputs pulse light with the center wavelength of 1064 nm and a spectrum width (full width at half maximum (hereinafter, referred to as "FWHM")) of 0.1 to 0.35 nm, the laser light source 11 may output laser light with a spectrum width (FWHM) of approximately 0.0001 nm and the center wavelength shifted on one side by approximately 0.1 nm from the center wavelength of the pulse light.

When the laser light source 11 that has an oscillation bandwidth that is wider than that of the seed light source 10 and includes the center wavelength of the seed light source 10 is used, the laser light with inherently low power and having wavelength bandwidth overwhelming the wavelength conversion characteristics of the nonlinear optical elements 60 and 70 does not result in output of light with large peak power.

Figure 5B:
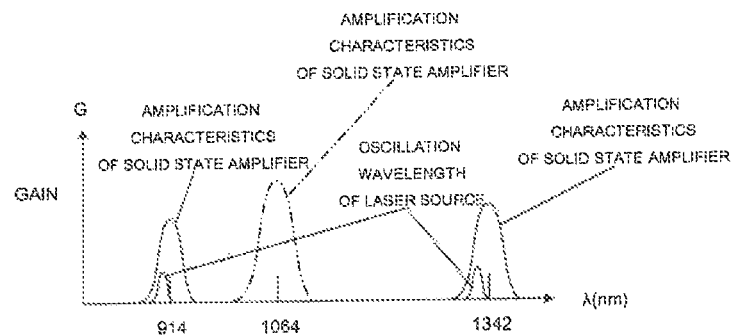

As illustrated in FIG. 5B, the laser light source 11 may be set to have an oscillation wavelength within an amplification band, in the amplification band of the solid state amplifier 50, outside the amplification band with which the pulse light output from the seed light source 10 can be amplified.

The solid state amplifier 50 may have a plurality of amplification bands, and the oscillation wavelength of the laser light source 11 may be set to be within one of the amplification bands other than that with which the pulse light output from the seed light source 10 can be amplified. In such a configuration, the excitation energy accumulated in the solid state amplifier 50 after the transition to the output stopped state can be consumed for amplifying the laser light output from the laser light source 11.

For example, the Nd:YVO4 crystal with three amplification bands with the center wavelengths of 914 μm, 1064 μm, and 1342 μm may be used for the solid state amplifier 50. In such a configuration, the oscillation wavelength of the laser light source 11 may be set to be within the amplification band not including the wavelength of 1064 μm of the pulse light output from the seed light source 10. Thus, the laser light, inherently having the wavelength outside the band with which the nonlinear optical element can perform the wavelength conversion, would not be output as the wavelength converted light.

The ASE noise, amplified by the solid state amplifier 50 in the period other than the output period of the pulse light from the seed light source 10, might enter the nonlinear optical elements 60 and 70. However, the ASE noise inherently has a low intensity and a wide wavelength bandwidth overwhelming the wavelength conversion characteristics of the nonlinear optical elements 60 and 70, and thus would not be output as light with large peak power.

The light output from the fiber amplifier 30 will not be amplified to light with large peak power, and thus can be blocked by the optical switching element 40 with no damage due to heat or the like on peripheral optical components including the optical switching element 40.

Thus, the nonlinear optical elements 60 and 70 function as a filter element that selectively converts the wavelength of the pulse light output from the seed light source 10 only, regardless of whether the oscillation wavelength for the pulse light output from the seed light source 10 and the oscillation wavelength for the laser light output from the laser light source 11 are the same or different from each other, so that the pulse light can be output with power high enough to process the processing target object.

Specifically, the driver D11 is provided with a feedback control circuit that performs feedback control on power of the laser light output from the laser light source 11, based on the amount of light input to the photodiode PD from the demultiplexer 24. Thus, the control unit 100 adjusts average power of the laser light output from the laser light source 11, via the driver D11. The demultiplexer 24 may be positioned on the output side of the fiber amplifier 30 on the downstream stage, and is more preferably positioned on the output side of the solid state amplifier 50.

The feedback control circuit may be omitted when the average power of the laser light output from the laser light source 11 to be input to the solid state amplifier 50 can be adjusted in such a manner that the solid state amplifier 50 can output light with substantially the same average power in the output stopped state and in the output permitted state. The laser light output from the laser light source 11 may be continuous light with power being the average power, or may be pulse light with the average power obtained as a time average value.

In the output stopped state, not only the laser light output from the laser light source 11 but also the ASE noise generated in the fiber amplifiers 20 and 30 on the upstream stage propagate to the solid state amplifier 50 via the optical switching element 40. The power of the laser light output from the laser light source 11 to be input to the solid state amplifier 50 is adjusted in such a manner that the solid state amplifier 50 can output the light with average power being substantially the same as that in the output permitted state, under this condition.

As a result, the energy discharged in the output stopped state can be substantially the same as that in the active region of the solid state amplifier 50 discharged in the output permitted state due to the excitation of the light source 51 for excitation. Thus, the temperature rise due to the solid state amplifier 50 emitting excessive amount of heat can be prevented even when the output permitted state transitions to the output stopped state with the power of the excitation light to the solid state amplifier 50 maintained.

As illustrated in FIG. 1, the light output from the laser light source 11 is combined with the pulse light output from the seed light source 10, at a portion on the upstream side of the optical switching element 40. Thus, when the apparatus transitions to the output stopped state, the control for making the laser light source 11 oscillate or stop oscillating in synchronization with the optical switching element 40 is not required. Instead, only the control for making the laser light source 11 oscillate is required.

The optical switching element 40 prevents the output light from the laser light source 11 from propagating in the output period of the pule light from the seed light source 10, and enables the output light from the laser light source 11 to be propagated in the period other than the output period of the pulse light from the seed light source 10. Thus, the laser light source 11 can be easily controlled.

The "output period of the pulse light from the seed light source", in which the optical switching element 40 is ON due to the control performed by the control unit 100, in the output permitted state is not necessarily the entire output period of the pulse light from the seed light source, and may be a part of such a period as long as the peak power of the pulse light, obtained by the wavelength conversion by the nonlinear optical element, can be within a range of appropriate values. Furthermore, the concept of the period includes short periods before and after the output period of the pulse light from the seed light source.

The "period other than the output period of the pulse light from the seed light source", in which the optical switching element 40 is OFF due to the control performed by the control unit 100, in the output permitted state is not necessarily the entire period including all the periods between the output periods of the sequential pulse light beams, that is, periods without the pulse light, and may be a part of such periods as long as the energy in the active region of the solid state amplifier, as a result of the excitation by the excitation light source, is not wastefully consumed for the ASE noise.

The "output period of the pulse light from the seed light source", in which the optical switching element 40 is OFF due to the control performed by the control unit 100, in the output stopped state is not necessarily the entire period during which the pulse light is output from the seed light source, and may be a part of such an entire period as long as the pulse light as a result of the wavelength conversion by the nonlinear optical element is weak, and includes small periods before and after the period during which the pulse light is output from the seed light source.

The "period other than the output period of the pulse light from the seed light source", in which the optical switching element 40 is ON due to the control performed by the control unit 100, in the output stopped state is not necessarily an entire period between the output periods of the sequential pulse light beams, that is, periods without the pulse light, and may be a part of such a period as long as the excessively excited state of the solid state amplifier can be canceled by the ASE noise. Furthermore, the period may not include all the periods between a plurality of pulse light output periods, and may be one such a period in every predetermined number of pulse light output periods.

Figure 6:
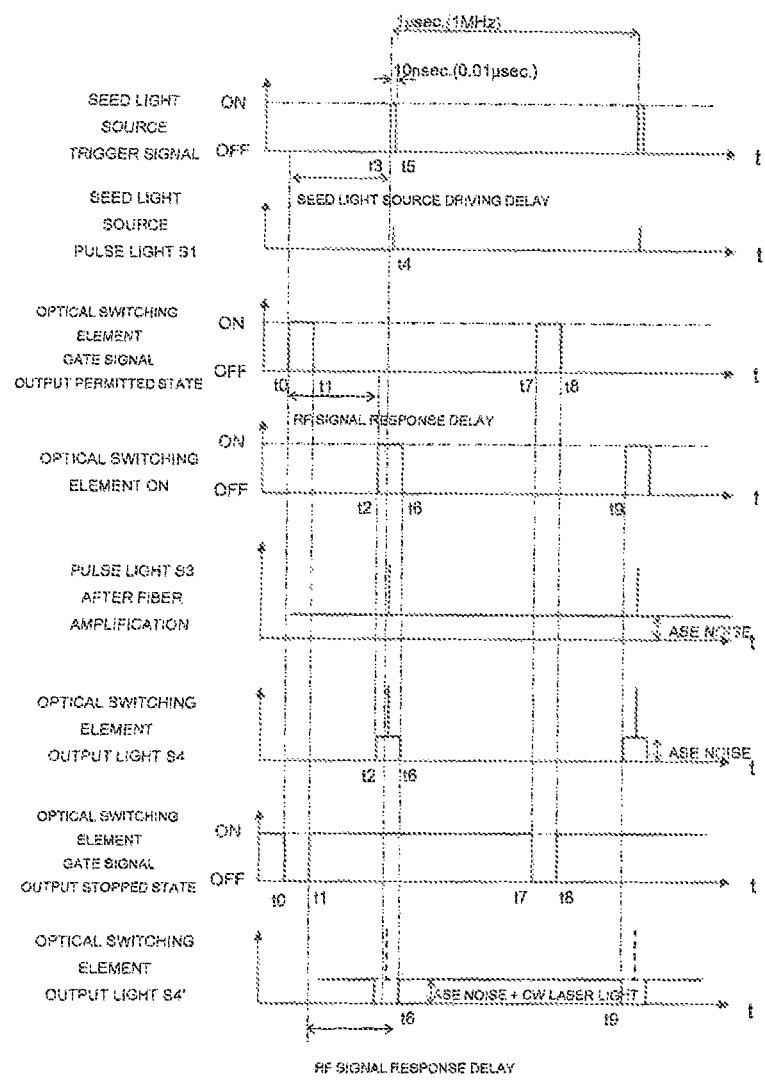
FIG. 6 is a timing chart illustrating timings for outputting a trigger signal for driving the first light source and a gate signal for driving the optical switching element, in accordance with optical pulse output d and permitted states.

FIG. 6 is a timing chart illustrating and example of control performed by the control unit 100 on the seed light source 10, the laser light source 11, and the optical switching element 40.

In the output permitted state, the signal is output to the RF driver D2 of the optical switching element 40 at a reference time point t0, and after a predetermined time delay, the trigger signal is turned ON and output to the driver D1 of the seed light source 10 at a time point t3. At a time point t4, the relaxation oscillation occurs, and the trigger signal is turned OFF at a predetermined time point t5 after the time point t4. Thus, pulse light S1 having a predetermined pulse width is obtained, and pulse light S3 as a result of the amplification by the fiber amplifiers 20 and 30 is obtained. The pulse light S3 has an increased bandwidth and the ASE noise superimposed thereon.

A configuration where at the predetermined time point t5, the driver D1 causes the seed light source 10, in which the relaxation oscillation has occurred, to stop the laser emission may be employed instead of the configuration in which the control unit 100 turns OFF the trigger signal at the time point t5 to stop the laser emission. In such a case, the trigger signal may be turned OFF at any timing.

The optical switching element 40 is turned ON at the time point t2 by the gate signal, turned ON and output at the time point t0, and is turned OFF at the time point t6 by the gate signal turned OFF at the time point t1. Output light S4, which has been amplified by the fiber amplifier 30 and has passed through the optical switching element 40, that is, pulse light S4 output from the seed light source 10 is propagated to the solid state amplifier 50 within the period between the time points t2 and t6 during which the optical switching element 40 is ON.

The ASE noise is prevented from propagating to the solid state amplifier 50 in a period between the time points t6 to t9 during which the optical switching element 40 is OFF. Thus, the excitation energy accumulated in the active region of the solid state amplifier 50 is prevented from being wastefully consumed.

In the output stopped state, the gate signal s output to the RF driver D2 of the optical switching element 40 at a reference time point t1, and after a predetermined time delay, the trigger signal is turned ON and output to the driver D1 of the seed light source 10 at the time point t3. At the time point t4, the relaxation oscillation occurs, and the trigger signal is turned OFF at the predetermined time point t5 after the time point t4. Thus, pulse light S1 having a predetermined pulse width is obtained, and pulse light S3 as a result of the amplification by the fiber amplifiers 20 and 30 is obtained.

The optical switching element 40 is turned ON at the time point t6 with the gate signal, turned ON and output at the time point t1, and is turned OFF at the time point t9 with the gate signal turned OFF at the e point t7. Output light S4', which has been combined with the ASE noise output from the fiber amplifier 30 and the laser light output from the laser light source 11, passes through the optical switching element 40 to be propagated to the solid state amplifier 50 within a period between the time points t6 and t9 during which the optical switching element 40 is ON. The pulse light S3 output from the seed light source 10 and a amplified by the fiber amplifiers 20 and 30 is prevented from propagating to the solid state amplifier 50, with the optical switching element 40 turned OFF in a period between the time points t2 and t6.

Control is performed in such a manner that the laser light source 11 oscillates at the time point t1 or the time point t6 at which the transition to the output stopped state occurs, and this state is maintained until the transition to the output permitted state occurs. In this state, the laser light source 11 outputs the laser light. The laser light source 11 may not output the laser light as continuous light, and may output pulse light. Either pattern of light may be output as long as the power of the light input to the solid state amplifier 50 is adjusted in such a manner that the solid state amplifier 50 outputs the light with substantially the same average power in the output stopped state and the output permitted state.

Here, the pulse light from the seed light source 10 is not input but the ASE noise and the laser light from the laser light source are input to the solid state amplifier 50. Thus, the excitation energy accumulated in the active region of the solid state amplifier 50 is discharged by the light, whereby the giant pulse is prevented from being generated and the output fluctuation is prevented when the output permitted state is achieved thereafter.

In the example described with reference to FIG. 6, the gate signal for the optical switching element 40 in the output permitted state has a phase shifted by 180° from that of the gate signal in the output stopped state. Thus, the ON state and the OFF state of the optical switching element 40 in the output stopped state are basically in an inverted relationship.

In FIG. 6, the ON state illustrated represents a state where the diffraction grating is formed in the optical switching element 40 due to the RF signal input, and thus the diffracted light propagates to the solid state amplifier 50. The OFF state illustrated represents a state where no diffraction grating is formed in the optical switching element 40, so that no light propagates to the solid state amplifier 50, and zero order light is attenuated by the damper. The control signal output to the optical switching element 40 may be a positive logic signal or may be a negative logic signal.

In the example described above, the optical switching element 40 is ON in the entire period between each two of the output periods for a plurality of pulse light beams repeatedly output from the seed light source 10 in the output stopped state. Alternatively, a configuration may be employed in which the optical switching element 40 is ON in a part of the period between each two of the output periods for a plurality of pulse light beams repeatedly output from the seed light source 10, as long as the power of the light from the laser light source 11 input to the solid state amplifier 50 is adjusted in such a manner that the solid state amplifier 50 outputs light with substantially the same average power as that in the output permitted state.

Furthermore, a configuration may be employed in which the optical switching element 40 is repeatedly turned ON and OFF in the period between each two of the output periods for a plurality of pulse light beams repeatedly output from the seed light source 10. With such control, heat emitted from the AOM of the optical switching element 40 can be reduced.

In the example illustrated in FIG. 6, the control unit 100 is configured to output the trigger signal to control the seed light source 10, based on the control signal (gate signal) for the optical switching element 40. In such a configuration, the optical switching element 40 can be appropriately driven with the control signal for controlling the seed light source 10 generated based on the control signal for the optical switching element 40, even when the response of the optical switching element 40 is slower than that of the pulse light output from the seed light source 10.

It is a matter of course that the optical switching element 40 can be controlled based on the control signal for the seed light source 10 when the response of the optical switching element 40 is sufficiently faster than that of the pulse light output from the seed light source 10.

All things considered, the control unit 100 described above executes a laser pulse light generating method including controlling, when the output of the pulse light from the nonlinear optical elements 60 and 70 is stopped, the optical switching element 40 disposed between the fiber amplifier 30 and the solid state amplifier 50 in such a manner that propagation of light is stopped in the output period of the pulse light from the seed light source 10, and permitted in a period other than the output period of the pulse light from the seed light source 10, and performing control in such a manner that the laser light source 11, disposed on the upstream side of the solid state amplifier 50, oscillates a laser light to be combined with the pulse light output from the seed light source 10, at least in the period other than the output period of the pulse light from the seed light source 10.

Similarly, the control unit 100 described above executes a laser pulse light generating method including controlling, when the output of the pulse light from the nonlinear optical elements 60 and 70 is permitted, the optical switching element 40 in such a manner that light is permitted to propagate in the output period of the pulse light from the seed light source 10, and stopped in a period other than the output period of the pulse light from the seed light source 10 and performing the control in such a manner that the laser light source 11 stops oscillating.

The present invention can be widely applied to laser light-source apparatuses that uses a seed light source that is driven by a frequency of several hundreds of megahertz or lower and a pulse width of several nanoseconds or shorter, preferably, several hundreds of picoseconds or shorter, as semiconductor lasers including a DFB laser.

Another embodiment of the present invention is described below.

In the embodiment described above, as an example where combining of the output light from the laser light source 11 with the pulse light output from the seed light source 10, occurs on the upstream side of the optical switching element 40, a mode in which the combining occurs on the input side of the fiber amplifier 20 on the upstream stage is described. Alternatively, a mode Where the combining occurs between the fiber amplifiers 20 and 30 in two stages, and a mode where the combining occurs on the output side of the fiber amplifier 30 on the downstream stage may be employed.

In an example in the embodiment described above, the power of the laser output from the laser light source 11 to be input to the solid state amplifier 50 is adjusted in such manner that the solid state amplifier 50 outputs the light with substantially the same average power in the output stopped state and in the output permitted state. Alternatively, an output duration may be adjusted with the power of the laser light output from the laser light source 11 maintained at a constant level, or the power and the output duration may both be adjusted.

The output duration of laser light from the laser light source 11 may be adjusted with the following modes: a mode with a driving period in which the laser light source 11 outputs the laser light controlled; and a mode with the optical switching element 40 controlled in such a manner that the period in which the laser light output from the laser light source 11 propagates to the solid state amplifier 50 is controlled.

The laser light source 11 may have any configuration in which the laser light output therefrom is combined with the pulse light output from the seed light source 10 that is disposed on the upstream side of the solid state amplifier 50. Thus, the combining of the laser light and the pulse light output froth the seed light source 10 may occur on the downstream side of the optical switching element 40.

In the embodiment described above, an example is described where, after the transition to the output stopped state occurs, the energy accumulated in the active region of the solid state amplifier 50 is discharged by using the continuous light including both the ASE noise propagated to the solid state amplifier 50 via the optical switching element 40 and the laser light output from the laser light source 11. The energy accumulated in the active region of the solid state amplifier 50 may be discharged by the laser light output from the laser light source 11 only, in the configuration where the combining of the laser light output from the laser light source 11 with the pulse light output from the seed light source 10 occurs on the downstream side of the optical switching element 40.

In such a configuration, control may be performed in such a manner that the optical switching element 40 is constantly in the OFF state, so that the propagation of the output light from the fiber amplifier 30 to the solid state amplifier 50 is prevented to stop the pulse light output from the nonlinear optical elements 60 and 70.

A bandpass filter may be further provided on the downstream side of the fiber amplifiers 20 and 30 in the embodiment described above. The bandpass filter reduces the bandwidth of pulse light having an increased bandwidth due to chirping effect, self-phase modulation and Raman scattering in an optical fiber, or the like.

A bandpass filter may also be provided between the seed light source 10 and the optical isolator ISL1 and between the optical isolator ISL1 and the fiber amplifier 20 to prevent the ASE noise from being reflected to the seed light source.

In the embodiment described above, an example is described where the acousto-optic element that turns ON or OFF the primary diffracted light in accordance with the turning ON or OFF of the ultrasound transducer is used as the optical switching element 40. Alternatively, an electro-optic element that turns ON and OFF light with an electric field in accordance with intensity modulation through EO modulation may be used as the optical switching element 40.

An extremely small rocking mirror, made by a micromachining technique (a mirror including Micro Electro Mechanical Systems (MEMS)), may be used as the optical switching element 40. Here, the propagation of the output from the fiber amplifier 30 to the solid state amplifier 50 may be permitted or stopped by switching a rocking angle of the extremely small rocking mirror. Furthermore, a polarization device that can control transmission and blocking of light by dynamically switching a polarization state may be used. In other words, the optical switching element may include a dynamic optical element.

In the embodiment described above, an example is described where the control unit 100 is provided that controls the optical switching element 10 in such a manner that the propagation of is permitted at an output timing of the pulse light from the seed light source 10 and stopped at a timing other than the output timing, when the output of the pulse light from the nonlinear optical elements 60 and 70 is permitted. The control unit 100 of the laser light-source apparatus according to the present invention may have any configuration as long as the optical switching element 40 is controlled and control is performed so that the laser light source 11 oscillates at least such a manner that the propagation of light is stopped at the output timing of the pulse light from the seed light source 10 and permitted at the timing other than the output timing, in a state where the output of the pulse light from the nonlinear optical element is stopped.

In the embodiment described above, the optical switching element 40 is provided between the fiber amplifier 30 and the solid state amplifier 50 to achieve the output stopped state in Which the output of the pulse light from the nonlinear optical elements 60 and 70 is stopped with the propagation of the pulse light from the seed light source 10 to the solid state amplifier 50 prevented. However, the present invention is not limited to such a mode.

For example, the output stopped state may be achieved without using the optical switching element 40, by stopping the output from the seed light source 10 and stopping the excitation light sources 21 and 31 for the fiber amplifiers 20 and 30.

The peak power of the pulse light after the amplification with a time width longer than the continuous light output from the laser light source 11 and the pulse light output from the seed light source 10 is sufficiently lower than the peak power of the pulse light output from the seed light source 10. Thus, efficiency of the wavelength conversion performed by the nonlinear optical elements 60 and 70 on the pulse light is low, and thus the pulse light is extremely less likely to be output with power high enough to process the processing target object.

However, when the power of the excitation light for the solid state amplifier 50 is sufficiently high, the wavelength converted light with considerable power might be output with the laser light output from the laser light source 11 in the output stopped state and amplified by the solid state amplifier 50 to be input to the nonlinear optical elements 60 and 70.

In such a configuration, the power of the excitation light of the solid state amplifier 50 and the power of the laser light output from the laser light source 11 may be adjusted in such a manner that the nonlinear optical elements 60 and 70 output the wavelength converted light with predetermined power only in the output permitted state.

An optical switching element that permits and stops the propagation of light from the solid state amplifier 50 to the nonlinear optical elements 60 and 70 may be further provided between the solid state amplifier 50 and the nonlinear optical elements 60 and 70. Thus, the control unit 100 may control the optical switching element in such a manner that the propagation of light from the solid state amplifier 50 to the nonlinear optical elements 60 and 70 is prevented in the output stopped state. This optical switching element may include an element that is the same as that of the optical switching element 40.

In the embodiment described above, an example is described where the DFB laser is used as the seed light source and employs the gain switching to generate single longitudinal mode pulse light having a higher intensity than in a normal state. In the present invention, any semiconductor laser may be used as the seed light source, and thus a general Fabry-Perot semiconductor laser other than the DFB laser may be used.

The present invention is not limited to the seed light source with an oscillation wavelength of 1064 nm. For example, seed light sources with different wavelengths, such as 1030 nm, 1550 nm, and 976 nm, may be selected as appropriate for different applications. Furthermore, these wavelengths may be used as the fundamental waves to generate harmonics, sum frequencies, and difference frequencies through the nonlinear optical element. A nonlinear optical element different from that described above may be used. For example, a BBO crystal, a KBBF crystal, an SBBO crystal, a KABO crystal, a BABO crystal, or the like may be used instead of the CLBO crystal.

Each of the plurality of embodiments described above is described as one embodiment of the present invention, and the scope of the present invention is not limited by the description. It is a matter of course that the specific circuit configurations of each component and optical elements used for circuits may be selected as appropriate or designed differently as long as the effects of the present invention are obtained.

The invention claimed is:

1. A laser light-source apparatus comprising:
   a first light source configured to output pulse light based on gain switching;
   a fiber amplifier configured to amplify the pulse light output from the first light source;
   a solid state amplifier configured to amplify the pulse light output from the fiber amplifier;
   a nonlinear optical element configured to perform wavelength conversion on the pulse light output from the solid state amplifier and output the resultant pulse light;
   a second light source that is provided on an upstream side of the solid state amplifier and is configured to output laser light that is able to be combined with the pulse light output from the first light source and that has an oscillation wavelength set to be within an amplification band of the solid state amplifier;
   an optical switching element that is disposed between the fiber amplifier and the solid state amplifier, and is configured to permit or stop propagation of light from the fiber amplifier to the solid state amplifier; and
   a control unit configured to achieve in an output permitted state in which the nonlinear optical element outputs the pulse light, an output stopped state in which the nonlinear optical element stops outputting the pulse light by stopping propagation of the pulse light from the first light source to the solid state amplifier by controlling the optical switching element, with power of excitation light to the solid state amplifier maintained, and to perform control in such a manner that the second light source oscillates in the output stopped state.

2. The laser light-source apparatus according to claim 1, wherein the control unit is configured to control the optical switching element in such a manner that the propagation of the light is permitted in a period other than the output period of the pulse light from the first light source in the output stopped state, and to perform control in such a manner that the second light source oscillates at least in the period other than the output period of the pulse light from the first light source outputs in the output stopped state.

3. The laser light source apparatus according to claim 2, wherein the laser light output from the second light source is configured to be capable of being combined with the pulse light output from the first light source, on an upstream side of the optical switching element, and wherein the control unit is configured to perform control in such a manner that the second light source oscillates in the output stopped state.

4. The laser light-source apparatus according to claim 2, wherein the control unit is configured to achieve the output permitted state in which the output of the pulse light from the nonlinear optical element is permitted by controlling the optical switching element in such a manner that the propagation of light is permitted in the output period of the pulse light from the first light source and is stopped in the period other than the output period of the pulse light from the first light source, and to perform control in such a manner that the second light source stops oscillating in the output permitted state.

5. The laser light-source apparatus according to claim 1, wherein the control unit is configured to achieve the output permitted state in which the output of the pulse light from the nonlinear optical element is permitted by controlling the optical switching element in such a manner that the propagation of light is permitted in the output period of the pulse light from the first light source and is stopped in the period other than the output period of the pulse light from the first light source, and to perform control in such a manner that the second light source stops oscillating in the output permitted state.

6. The laser light source apparatus according to claim 5, wherein the laser light output from the second light source is configured to be capable of being combined with the pulse light output from the first light source, on an upstream side of the optical switching element, and wherein the control unit is configured to perform control in such a manner that the second light source oscillates in the output stopped state.

7. The laser light source apparatus according to claim 1, wherein the control unit is configured to adjust power of the laser light output from the second light source to be input to the solid state amplifier in such a manner that the solid state amplifier outputs light with a same average power in the output stopped state and in the output permitted state.

8. The laser light source apparatus according to claim 1, wherein power of excitation light from the solid state amplifier and/or a pulse rate of the pulse light is adjusted in such a manner that the nonlinear optical element outputs wavelength converted light with predetermined power only in the output permitted state.

9. The laser light-source apparatus according to claim 1, wherein the control unit is configured to control the optical switching element in such a manner that the propagation of light from the solid state amplifier to the nonlinear optical element is stopped in the output stopped state.

10. The laser light-source apparatus according to claim 1, wherein the pulse light output from the first light source is able to be amplified in the solid state amplifier, the amplification band of which the oscillation wavelength of the second light source is set to be within.

11. The laser light-source apparatus according to claim 1, wherein the optical switching element includes a dynamic optical element.

12. The laser light-source apparatus according to claim 1, wherein the first light source includes a distributed feedback (DFB) laser, and
wherein the control unit is configured to drive the DFB laser with a frequency of several megahertz or lower and a pulse width of several hundreds of nanoseconds or shorter.

13. A laser light-source apparatus comprising:
a first light source configured to output pulse light based on gain switching;
a fiber amplifier configured to amplify the pulse light output from the first light source;
a solid state amplifier configured to amplify the pulse light output from the fiber amplifier;
a nonlinear optical element configured to perform wavelength conversion on the pulse light output from the solid state amplifier and output the resultant pulse light;
a second light source that is provided on an upstream side of the solid state amplifier and is configured to output laser light that is able to be combined with the pulse light output from the first light source; and
a control unit configured to achieve in an output permitted state in which the nonlinear optical element outputs the pulse light, an output stopped state in which the nonlinear optical element stops outputting the pulse light by stopping propagation of the pulse light from the first light source to the solid state amplifier, with power of excitation light to the solid state amplifier maintained, and to perform control in such a manner that the second light source oscillates in the output stopped state,
wherein the second light source has an oscillation wavelength in an amplification band of the solid state amplifier, different from an amplification band in which the pulse light output from the first light source is able to be amplified.

14. A laser pulse light generating method in which pulse light output from a first light source based on gain switching is sequentially amplified by a fiber amplifier and a solid state amplifier, subjected to wavelength conversion by a nonlinear optical element, and then is output, the method comprising:
stopping propagation of the pulse light from the first light source to the solid state amplifier with power of excitation light to the solid state amplifier maintained through an optical switching element provided between the fiber amplifier and the solid state amplifier; and
performing control in such a manner that a second light source that is provided on an upstream side of the solid state amplifier and is configured to output laser light that is able to be combined with the pulse light output from the first light source and that has an oscillation wavelength set to be within an amplification band of the solid state amplifier oscillates, when the output of the pulse light from the nonlinear optical element is stopped.

15. The laser pulse light generating method according to claim 14, further comprising:
controlling optical switching element in such a manner that the propagation of light is stopped in an output period of the pulse light from the first light source and is permitted in a period other than the output period of the pulse light from the first light source; and
performing control in such a manner that the second light that is provided on the upstream side of the solid state amplifier and is configured to output the laser light that is able to be combined with the pulse light output from the first light source oscillates at least in the period other than the output period of the pulse light from the first light source.

16. The laser pulse light generating method according to claim 15, further comprising:
controlling the optical switching element in such a manner that the propagation of light is permitted in the output period of the pulse light from the first light source and stopped in the period other than the output period of the pulse light from the first light source; and
performing control in such a manner that the second light source stops oscillating, when the output of the pulse light from the nonlinear optical element is permitted.

* * * * *